US011217478B2

(12) United States Patent
Kao et al.

(10) Patent No.: US 11,217,478 B2
(45) Date of Patent: Jan. 4, 2022

(54) INTEGRATED CIRCUIT (IC) STRUCTURE FOR HIGH PERFORMANCE AND FUNCTIONAL DENSITY

(71) Applicant: Taiwan Semiconductor Manufacturing Co., Ltd., Hsin-Chu (TW)

(72) Inventors: Min-Feng Kao, Chiayi (TW); Dun-Nian Yaung, Taipei (TW); Hsing-Chih Lin, Tainan (TW); Jen-Cheng Liu, Hsin-Chu (TW); Kuan-Chieh Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 51 days.

(21) Appl. No.: 16/600,826

(22) Filed: Oct. 14, 2019

(65) Prior Publication Data
US 2020/0043783 A1 Feb. 6, 2020

Related U.S. Application Data

(63) Continuation of application No. 15/218,488, filed on Jul. 25, 2016, now Pat. No. 10,510,592.

(51) Int. Cl.
*H01L 21/768* (2006.01)
*H01L 27/088* (2006.01)
(Continued)

(52) U.S. Cl.
CPC .. *H01L 21/76877* (2013.01); *H01L 21/76254* (2013.01); *H01L 21/76898* (2013.01);
(Continued)

(58) Field of Classification Search
CPC ......... H01L 21/76877; H01L 21/76254; H01L 23/522; H01L 23/481; H01L 27/0694;
(Continued)

(56) References Cited

U.S. PATENT DOCUMENTS 10,510,592 B2 * 12/2019 Kao .................. H01L 21/76254
2006/0057836 A1 3/2006 Nagarajan et al.
(Continued)

OTHER PUBLICATIONS

Carta, Fabio. "Excimer Laser Crystallization of Silicon Thin Films for Monolithic 3D Integration." Columbia University. Published in 2015.
(Continued)

*Primary Examiner* — Patricia D Reddington
(74) *Attorney, Agent, or Firm* — Eschweiler & Potashnik, LLC

(57) ABSTRACT

An integrated circuit (IC) provides high performance and high functional density. A first back-end-of-line (BEOL) interconnect structure and a second BEOL interconnect structure are respectively under and over a semiconductor substrate. A first electronic device and a second electronic device are between the semiconductor substrate and respectively a bottom of the first BEOL interconnect structure and a top of the second BEOL interconnect structure. A through substrate via (TSV) extends through the semiconductor
(Continued)

substrate, from the first BEOL interconnect structure to the second BEOL interconnect structure. A method for manufacturing the IC is also provided.

20 Claims, 12 Drawing Sheets

(51) Int. Cl.
*H01L 21/762* (2006.01)
*H01L 23/522* (2006.01)
*H01L 23/48* (2006.01)
*H01L 27/06* (2006.01)
*H01L 21/822* (2006.01)
*H01L 23/525* (2006.01)

(52) U.S. Cl.
CPC ........ *H01L 21/8221* (2013.01); *H01L 23/481* (2013.01); *H01L 23/522* (2013.01); *H01L 27/0688* (2013.01); *H01L 27/0694* (2013.01); *H01L 27/088* (2013.01); *H01L 23/525* (2013.01); *H01L 2224/48227* (2013.01); *H01L 2924/00* (2013.01); *H01L 2924/13091* (2013.01); *H01L 2924/14* (2013.01)

(58) Field of Classification Search
CPC ............. H01L 27/0688; H01L 21/8221; H01L 21/76898; H01L 27/088; H01L 23/525; H01L 2924/14; H01L 2924/00; H01L 2224/11; H01L 2924/13091; H01L 2224/48227
See application file for complete search history.

(56) References Cited

U.S. PATENT DOCUMENTS

| | | |
|---|---|---|
| 2007/0166997 A1 | 7/2007 | Knorr |
| 2010/0224876 A1* | 9/2010 | Zhu ................ H01L 27/0694 257/52 |
| 2010/0264551 A1 | 10/2010 | Farooq et al. |
| 2012/0025199 A1 | 2/2012 | Chen et al. |
| 2012/0193785 A1* | 8/2012 | Lin .................... H01L 24/97 257/737 |
| 2013/0087855 A1 | 4/2013 | Makiyama et al. |
| 2013/0134596 A1 | 5/2013 | Hu et al. |
| 2013/0168740 A1 | 7/2013 | Chen |
| 2016/0379962 A1 | 12/2016 | Huang et al. |
| 2017/0025384 A1 | 1/2017 | Park et al. |
| 2017/0084614 A1 | 3/2017 | Wu et al. |

OTHER PUBLICATIONS

Celler, et al. " Smart Cut: A Guide to the Technology, the Process, the Products." Jul. 2003.
Zhichao, et al. "3D Stackable FinFETs and UTB Transistors." NANO Communication, vol. 20, No. 3. Jul. 11, 2016.
Non-Final Office Action dated Jul. 27, 2017 for U.S. Appl. No. 15/218,488.
Final Office Action dated Feb. 9, 2018 for U.S. Appl. No. 15/218,488.
Non-Final Office Action dated Jan. 28, 2019 for U.S. Appl. No. 15/218,488.
Notice of Allowance dated Aug. 14, 2019 for U.S. Appl. No. 15/218,488.

* cited by examiner

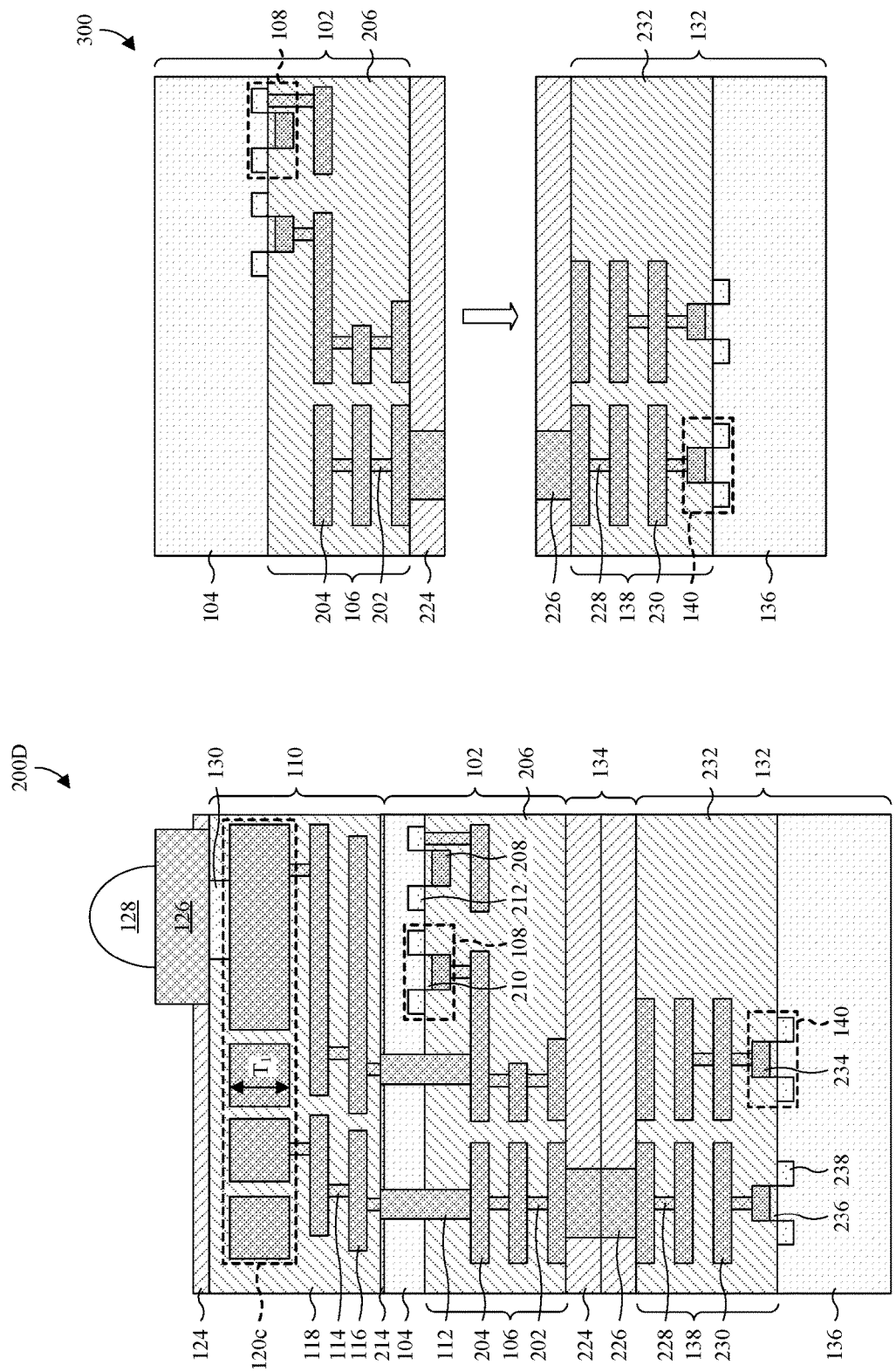

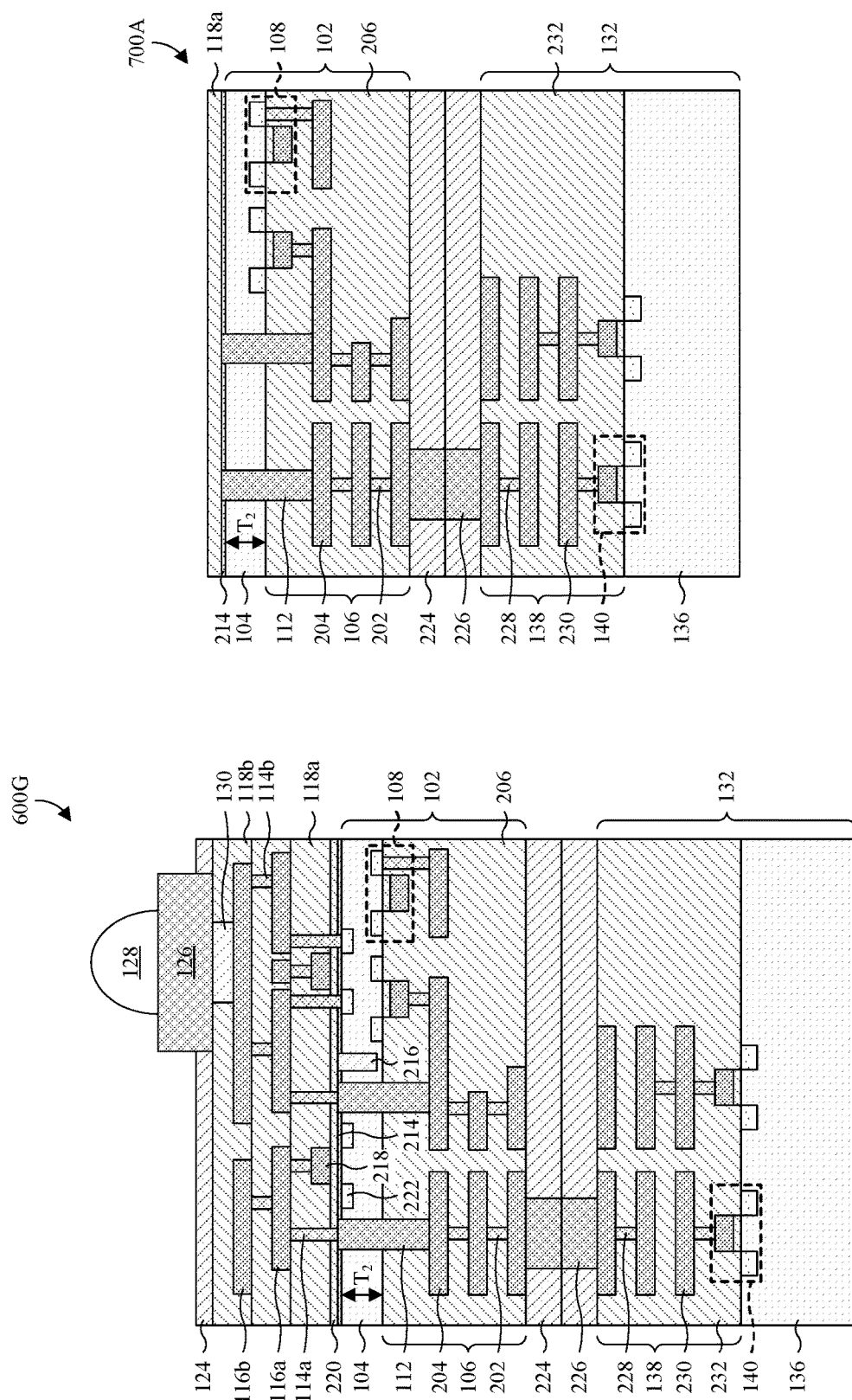

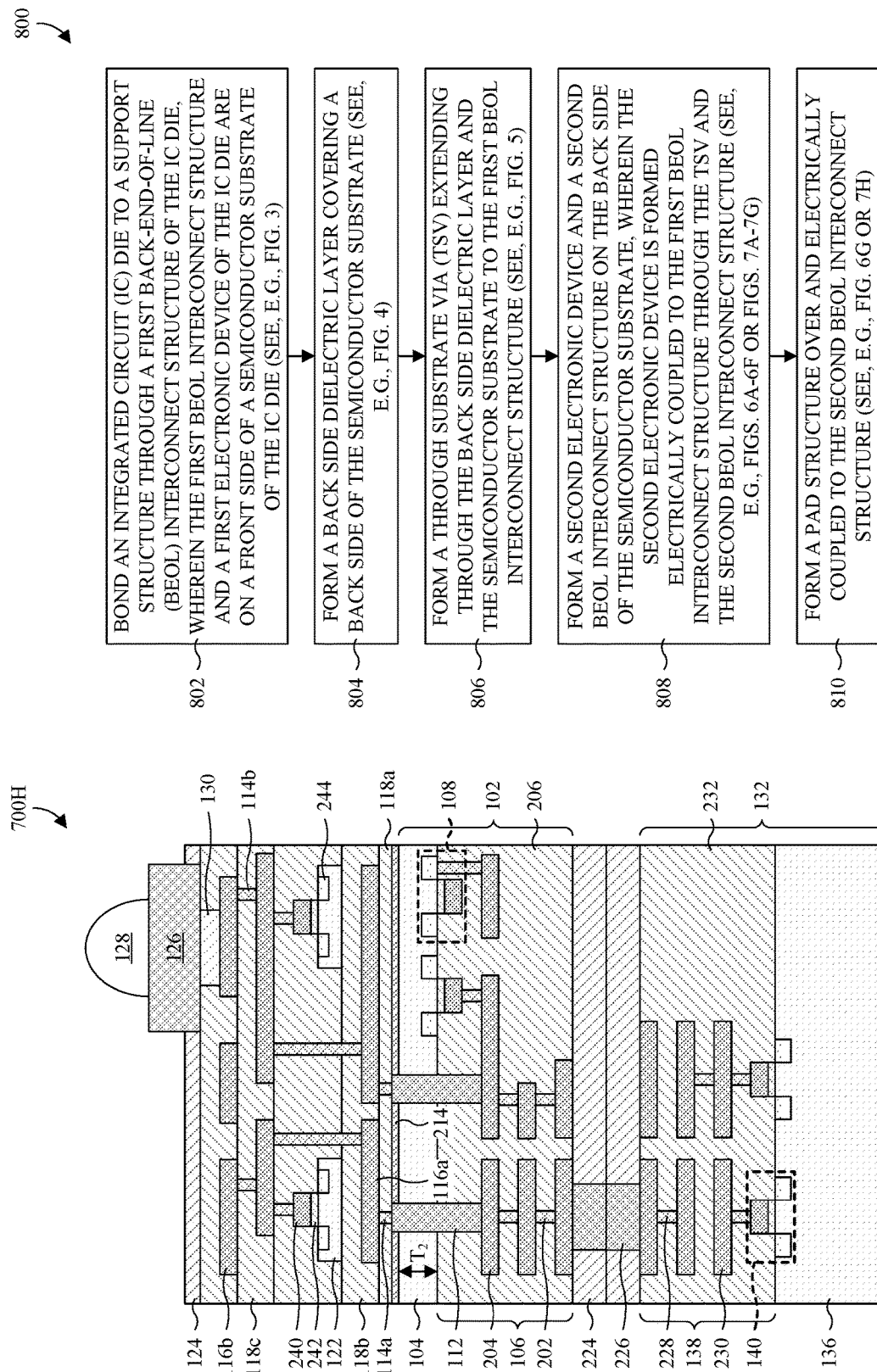

INTEGRATED CIRCUIT (IC) STRUCTURE FOR HIGH PERFORMANCE AND FUNCTIONAL DENSITY

REFERENCE TO RELATED APPLICATION

This Application is a Continuation of U.S. application Ser. No. 15/218,488, filed on Jul. 25, 2016, the contents of which are hereby incorporated by reference in their entirety.

BACKGROUND

Integrated circuits (ICs) have experienced continuous rapid growth in functional density since inception. In large part, this growth has come from repeated reduction in minimum feature size, thereby allowing more electronic devices to be integrated into a given area. However, in recent years, process limitations have made it difficult to continue reducing the minimum feature size. Therefore, alternative approaches for increasing functional density have emerged. One such approach is the vertical integration of IC dies into three-dimensional integrated circuits (3D ICs). By vertically integrating IC dies into 3D ICs, footprints are reduced and metal interconnect distance is shortened, thereby improving processing capabilities and reducing power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D illustrate cross-sectional views of some more detailed embodiments of the IC of FIG. 1.

FIGS. 3-5, 6A-6G, and 7A-7H illustrate a series of cross-sectional views for various embodiments of a method of manufacturing an IC with electronic devices arranged on both a front side of a semiconductor substrate and a back side of the semiconductor substrate.

FIG. 8 illustrates a flowchart of some embodiments of the method of FIGS. 3-5, 6A-6G, and 7A-7H.

DETAILED DESCRIPTION

Figure 2A:
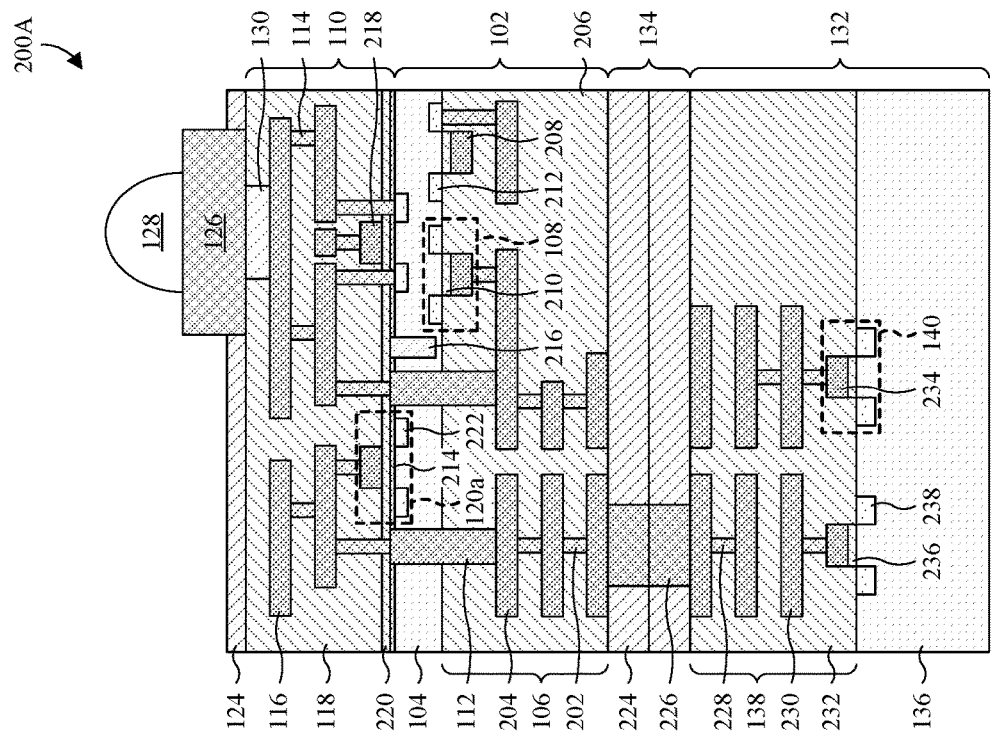

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) often comprises a back-end-of-line (BEOL) interconnect structure and electronic devices on a front side of a semiconductor substrate. The electronic devices may, for example, be in the BEOL interconnect structure, and/or between the semiconductor substrate and the BEOL interconnect structure. Further, in some instances, the IC also comprises pad structures on a back side of the semiconductor substrate to provide electrical coupling to the IC. A shortcoming with the IC is that the electronic devices are limited to the front side of the semiconductor substrate, thereby limiting a functional density of the IC.

In view of the foregoing, the present application is directed towards an IC in which electronic devices are arranged on both front and back sides of a semiconductor substrate. In some embodiments, a first electronic device is arranged in the semiconductor substrate, on a front side of the semiconductor substrate. A second electronic device is arranged on a back side of the semiconductor substrate that is opposite the front side of the semiconductor substrate. A through substrate via extends through the semiconductor substrate to electrically couple the first or second electronic device respectively to the back side or front side of the semiconductor substrate. Further, in some embodiments, the IC is arranged in a 3D IC and bonded to another IC through the front side of the semiconductor substrate.

Advantageously, by arranging electronic devices on both the front and back sides of the semiconductor substrate, the functional density of the IC may be high and/or the size of the IC may be small. Further, design freedom and flexibility may be high since electronic devices may be distributed between the front and back sides of the semiconductor substrate. For example, a BEOL interconnect structure on the back side of the semiconductor substrate may use different metal thicknesses than a BEOL interconnect structure on the front side of the semiconductor substrate for different routing resistance and/or delay. Even more, power consumption is low and performance is high since metal interconnect distance is short between the front and back sides of the semiconductor substrate.

Figure 1:
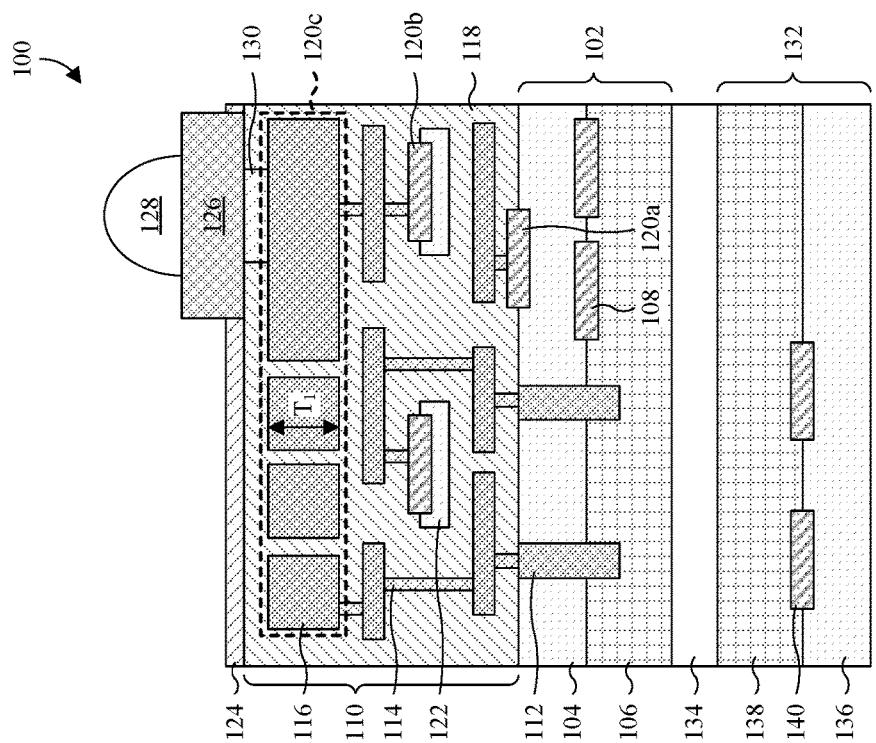
FIG. 1 illustrates a cross-sectional view of some embodiments of an integrated circuit (IC) with electronic devices arranged on both a front side of a semiconductor substrate and a back side of the semiconductor substrate.

With reference to FIG. 1, a cross sectional view 100 of some embodiments of an IC for high performance and high functional density is provided. As illustrated, a first IC die 102 comprises a first semiconductor substrate 104 and a first BEOL interconnect structure 106. The first semiconductor substrate 104 may be, for example, a bulk substrate of monocrystalline silicon or some other semiconductor. The first BEOL interconnect structure 106 underlies the first semiconductor substrate 104, on a front side of the first semiconductor substrate 104, and comprises first via layers (not shown) and first wiring layers (not shown) alternatingly stacked within a first interlayer dielectric (ILD) layer (not shown).

First electronic devices 108 are arranged on the front side of the first semiconductor substrate 104, between the first semiconductor substrate 104 and the first BEOL interconnect structure 106, and/or are arranged in the first BEOL interconnect structure 106. The first electronic devices 108 comprise active and/or passive electronic devices and are electrically coupled to the first BEOL interconnect structure 106. As used herein, active electronic devices vary the flow of electrical current based on a control signal and passive electronic devices vary the flow of electrical current without a control signal.

A second BEOL interconnect structure 110 is arranged over the first semiconductor substrate 104, on a back side of the first semiconductor substrate 104. The second BEOL interconnect structure 110 is electrically coupled to the first BEOL interconnect structure 106 by through substrate vias (TSVs) 112 extending through the first semiconductor substrate 104. The TSVs 112 may be, for example, copper, aluminum copper, aluminum, tungsten, some other conductive material or metal, or a combination of the foregoing. The second BEOL interconnect structure 110 comprises second via layers 114 and second wiring layers 116 alternatingly stacked within a second ILD layer 118. In some embodiments, the second BEOL interconnect structure 110 comprises about 20-40 wiring layers, such as about 30 wiring layers. The second ILD layer 118 may be, for example, phosphosilicate glass (PSG), silicon dioxide, a low κ dielectric, some other dielectric, or a combination of the foregoing. As used herein, a low κ dielectric is a dielectric with a dielectric constant less than about 3.9.

The second via layers 114 electrically couple neighboring pairs of second wiring layers 116 together, and the second wiring layers 116 electrically couple neighboring pairs of second via layers 114 together. In some embodiments, thicknesses $T_1$ of the second wiring layers 116 vary based on resistance and delay considerations. For example, a top one of the second wiring layers 116 may have a greater thickness than a remainder of the second wiring layers 116. The second via layers 114 and the second wiring layers 116 may, for example, be copper, aluminum copper, aluminum, tungsten, some other metal or conductive material, or a combination of the foregoing.

Second electronic devices 120a, 120b, 120c are arranged on the back side of the first semiconductor substrate 104, between the first semiconductor substrate 104 and the second BEOL interconnect structure 110, and/or are arranged in the second BEOL interconnect structure 110. For example, the second electronic devices 120a, 120b, 120c may comprise a second electronic device 120a, such as a transistor or a memory cell, that is arranged in the first semiconductor substrate 104, between the first semiconductor substrate 104 and the second BEOL interconnect structure 110. As another example, the second electronic devices 120a, 120b, 120c may comprise a second electronic device 120b, such as a transistor or a memory cell, that is arranged in an epitaxial layer 122 of the second BEOL interconnect structure 110, between the epitaxial layer 122 and a neighboring one of the second wiring layers 116. The epitaxial layer 122 may be, for example, monocrystalline silicon or some other semiconductor material. As yet another example, the second electronic devices 120a, 120b, 120c may comprise a second electronic device 120c, such as a passive inductor or a passive capacitor, that is defined by at least one of the second wiring layers 116. The second electronic devices 120a, 120b, 120c are active and/or passive electronic devices, and may include, for example, transistors (e.g., ultra-thin body transistors), vacuum tubes, inductors, capacitors, ring resonators, power combiners, couplers, microstrips, antennas, or a combination of the foregoing. Further, the second electronic devices 120a, 120b, 120c are electrically coupled to the second BEOL interconnect structure 110 and, in some embodiments, are electrically coupled to the first electronic devices 108 through the first and second BEOL interconnect structures 106, 110 and the TSVs 112.

In some embodiments, a passivation layer 124 and a pad structure 126 are arranged over the second BEOL interconnect structure 110. The passivation layer 124 may be, for example, silicon nitride, silicon dioxide, some other dielectric, or a combination of the foregoing. The pad structure 126 is recessed into the passivation layer 124 and may, for example, support a solder ball 128 and/or may, for example, be connected to a wire bond (not shown). Further, the pad structure 126 is electrically coupled to the second BEOL interconnect structure 110 by a pad via 130 extending from the pad structure 126, into the second ILD layer 118, to a top one of the second wiring layers 116. The pad structure 126 and pad via 130 may be, for example, aluminum, copper, aluminum copper, copper, or a combination of the foregoing.

Further, in some embodiments, a support structure 132 is arranged under and bonded to the first IC die 102 through a die-to-die (D2D) interface 134. The D2D interface layer 134 may be, for example, a fusion bond, epoxy bond, hybrid bond, or micro bump interface layer. The support structure 132 may be, for example, a carrier substrate, such as a bulk substrate of monocrystalline silicon, some other semiconductor, or glass. Alternatively, the support structure 132 may be, for example, a second IC die.

The second IC die comprises a second semiconductor substrate 136 and a third BEOL interconnect structure 138. The third BEOL interconnect structure 138 is arranged over the second semiconductor substrate 136, on a front side of the second semiconductor substrate 136, and is bonded and electrically coupled to the first BEOL interconnect structure 110 through the D2D interface layer 134. The third BEOL interconnect structure 138 comprises third via layers (not shown) and third wiring layers (not shown) alternatingly stacked within a third interlayer dielectric (ILD) layer (not shown).

Third electronic devices 140 are arranged on the front side of the second semiconductor substrate 136, between the second semiconductor substrate 136 and the third BEOL interconnect structure 138, and/or are arranged in the third BEOL interconnect structure 138. The third electronic devices 140 comprise active and/or passive electronic devices and are electrically coupled to the third BEOL interconnect structure 138. In some embodiments, the third electronic devices 140 are electrically coupled to the first and/or second electronic devices 108, 120a-120c through a combination of the first, second, and third BEOL interconnect structures 106, 110, 138, the TSVs 223, and the D2D interface layer 134.

Advantageously, by arranging electronic devices (e.g., the first and second electronic devices 108, 120a-120c) on both the front and back sides of the first semiconductor substrate 104, the functional density of the IC may be high and/or the size of the IC may be small. The functional density of the IC may also be high because of the stacking between the first IC die 102 and the second IC die (corresponding to support structure 132). Further, design freedom and flexibility may be high since electronic devices may be distributed between the front and back sides of the first semiconductor substrate 104. Even more, power consumption is low and performance is high since the TSVs 112 provide a short path between the front and back sides of the first semiconductor substrate 104.

With reference to FIGS. 2A-2D, cross sectional views 200A-200D of some more detailed embodiments of the IC of FIG. 1 are provided.

As illustrated by the cross-sectional view 200A of FIG. 2A, a first IC die 102 comprises a first semiconductor substrate 104 and a first BEOL interconnect structure 106. The first BEOL interconnect structure 106 underlies the first semiconductor substrate 104, on a front side of the first semiconductor substrate 104, and comprises first via layers 202 and first wiring layers 204 alternatingly stacked within a first ILD layer 206. The first via layers 202 electrically couple neighboring pairs of first wiring layers 204 together, and the first wiring layers 204 electrically couple neighboring pairs of first via layers 202 together. The first via layers 202 and the first wiring layers 204 may, for example, be copper, aluminum copper, aluminum, tungsten, some other metal or conductive material, or a combination of the foregoing. The first ILD layer 206 may be, for example, PSG, silicon dioxide, a low κ dielectric, some other dielectric, or a combination of the foregoing.

First electronic devices 108 are arranged on the front side of the first semiconductor substrate 104, between the first semiconductor substrate 104 and the first BEOL interconnect structure 106, and/or are arranged in the first BEOL interconnect structure 106. In some embodiments, the first electronic devices 108 comprise first transistors arranged in the first semiconductor substrate 104, between the first semiconductor substrate 104 and the first BEOL interconnect structure 106. The first transistors may, for example, comprise corresponding gate electrodes 208 and a gate dielectric layer 210 spacing the gate electrodes 208 from the first semiconductor substrate 104. Further, the first transistors may, for example, comprise a corresponding pair of doped source/drain regions 212 arranged in the first semiconductor substrate 104, respectively on opposite sides of the gate electrodes 208.

A second BEOL interconnect structure 110 is arranged over the first semiconductor substrate 104, on a back side of the first semiconductor substrate 104. The second BEOL interconnect structure 110 comprises second via layers 114 and second wiring layers 116 alternatingly stacked within a second ILD layer 118, and is electrically coupled to the first BEOL interconnect structure 106 by TSVs 112. The TSVs 112 extend through the first semiconductor substrate 104 to electrically couple with the first and second BEOL interconnect structures 106, 110. Further, in some embodiments, the second BEOL interconnect structure 110 comprises a back side dielectric layer 214 arranged between the second ILD layer 118 and the first semiconductor substrate 104, and through which the TSVs 112 extend. The back side dielectric layer 214 may be, for example, silicon dioxide, silicon nitride, some other dielectric layer, or a combination of the foregoing.

Second electronic devices 120a are arranged on or in the back side of the first semiconductor substrate 104, between the first semiconductor substrate 104 and the second ILD layer 118. Further, the second electronic devices 120a are are electrically coupled to the second BEOL interconnect structure 110 and, in some embodiments, are electrically coupled to the first electronic devices 108 and/or the first BEOL interconnect structure 106 through the second BEOL interconnect structure 110 and the TSVs 112. In some embodiments, the second electronic devices 120a are laterally spaced and electrically isolated from one another by a back side isolation region 216. The back side isolation region 216 extends into the back side of the first semiconductor substrate 104, and may be, for example, a back side deep trench isolation (BDTI) regions, a back side shallow trench isolation region (BSTI), or a back side implant isolation region. The second electronic devices 120a are active and/or passive electronic devices and, in some embodiments, comprise second transistors.

The second transistors may, for example, comprise corresponding gate electrodes 218, a gate dielectric layer 220, and corresponding pairs of source/drain regions 222. The gate dielectric layer 220 is arranged over and, in some embodiments, covers the TSVs 112. Further, in some embodiments, the gate dielectric layer 220 is arranged over and/or covers the back side dielectric layer 214 and/or the back side isolation region 216. The gate dielectric layer 220 and, in some embodiments, the back side dielectric layer 214 space and insulate the gate electrodes 218 from the first semiconductor substrate 104. Further, in some embodiments, the gate dielectric layer 220 is patterned, such that the gate dielectric layer 220 comprises individual segments localized under corresponding ones of the gate electrodes 218. The gate dielectric layer 220 may be, for example, be silicon dioxide, silicon nitride, aluminum oxide, a high κ dielectric, some other dielectric layer, or a combination of the foregoing. As used herein, a high κ dielectric is a dielectric with a dielectric constant greater than about 3.9. The gate electrode 218 may be metal, such titanium nitride, or doped polysilicon. The source/drain regions 222 are doped regions of the first semiconductor substrate 104 that are respectively arranged on opposite sides of the gate electrodes 218.

In some embodiments, a support structure 132 is arranged under and bonded to the first IC die 102 through a die-to-die (D2D) interface layer 134. The support structure 132 may be, for example, a carrier substrate. Alternatively, the support structure 132 may be, for example, a second IC die. Where the support structure 132 is the second IC die, the D2D interface layer 134 both bonds and electrically couples the second IC die to the first IC die 102. For example, where the support structure 132 is the second IC die, the D2D interface layer 134 may be a hybrid bond interface layer.

The hybrid bond interface layer comprises a pair of inter-die dielectric (IDD) layers 224 and a pair of inter-die redistribution layers (RDLs) 226. The IDD layers 224 are respectively arranged on the first IC die 102 and the second IC die, and interface at a hybrid bond interface. The IDD layers 224 may be, for example, silicon dioxide, silicon nitride, some other dielectric, or combinations of the foregoing. The inter-die RDLs 226 are respectively arranged on the first IC die 102 and the second IC die, and are respectively arranged within the IDD layers 224. Further, the inter-die RDLs 226 interface at the hybrid bond interface and are electrically coupled respectively to the first IC die 102 and the second IC die. The inter-die RDLs 226 may be, for example, copper, aluminum copper, aluminum, tungsten, some other conductive material or metal, or combinations of the foregoing.

In some embodiments, the second IC die comprises a second semiconductor substrate 136 over which third electronic devices 140 and a third BEOL interconnect structure 138 are arranged. The third BEOL interconnect structure 138 comprises third via layers 228 and third wiring layers 230 alternatingly stacked within a third ILD layer 232. The third via layers 228 electrically couple neighboring pairs of third wiring layers 230 together, and the third wiring layers 230 electrically couple neighboring pairs of third via layers 228 together. The third via layers 228 and the third wiring layers 230 may, for example, be copper, aluminum copper, aluminum, tungsten, some other metal or conductive material, or a combination of the foregoing. The third ILD layer 232 may be, for example, PSG, silicon dioxide, a low κ dielectric, some other dielectric, or a combination of the foregoing.

The third electronic devices 140 are arranged in the second semiconductor substrate 136, between the second semiconductor substrate 136 and the third BEOL interconnect structure 138, and/or are arranged in the third BEOL interconnect structure 138. In some embodiments, the third electronic devices 140 comprise third transistors arranged in the second semiconductor substrate 136, between the second semiconductor substrate 136 and the third BEOL interconnect structure 138. The third transistors may, for example, comprise corresponding gate electrodes 234 and a gate dielectric layer 236 spacing the gate electrodes 234 from the second semiconductor substrate 136. Further, the third transistors may, for example, comprise corresponding pairs of doped source/drain regions 238 arranged in the second semiconductor substrate 136, respectively on opposite sides of the gate electrode 234.

Figure 2C:
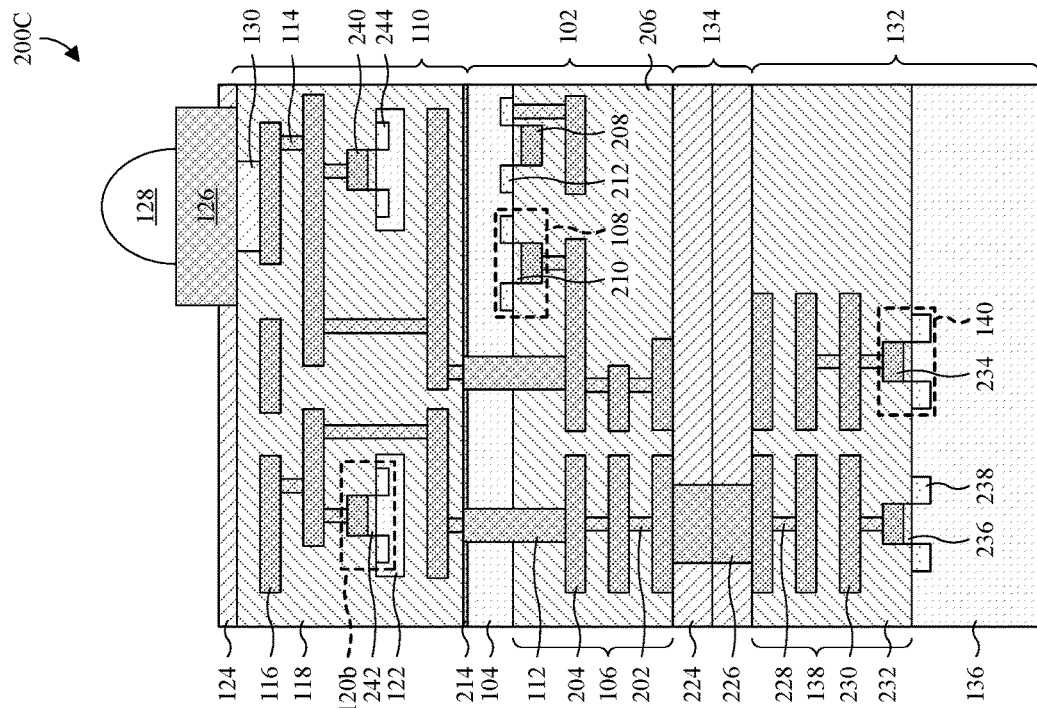
Figure 2B:
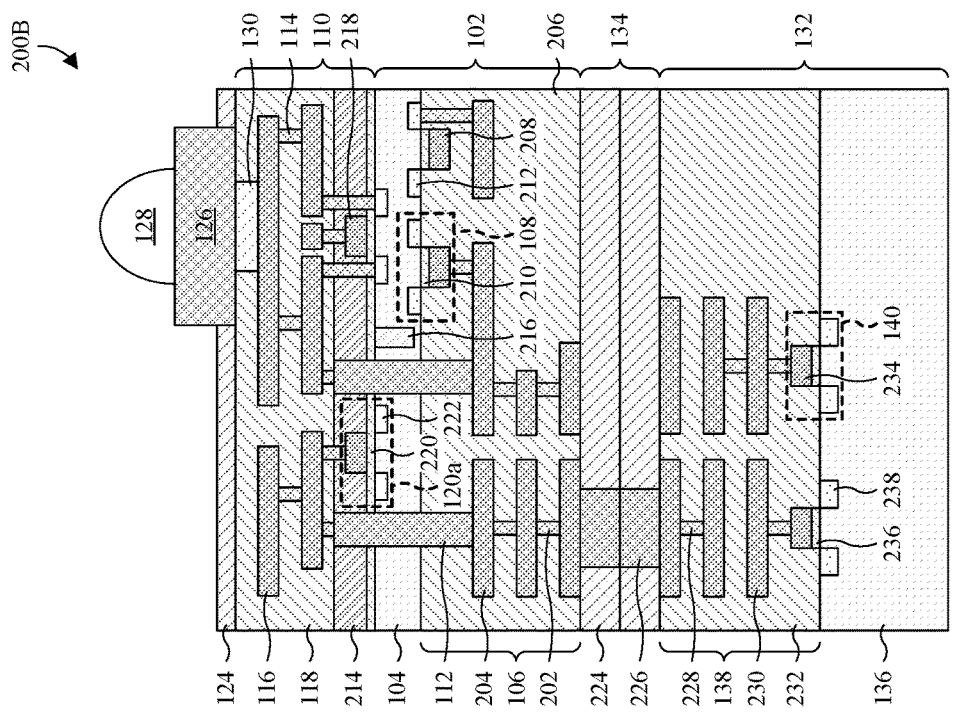

As illustrated by the cross-sectional view 200B of FIG. 2B, a variant of FIG. 2A is provided in which the back side dielectric layer 214 covers the second transistors of the second electronic devices 120a.

As illustrated by the cross-sectional view 200C of FIG. 2C, a variant of FIG. 2A is provided in which an epitaxial layer 122 is arranged in the second BEOL interconnect structure 110, between a pair of neighboring wiring layers of the second BEOL interconnect structure 110. The epitaxial layer 122 supports second electronic devices 120b and, in some embodiments, is divided into individual segments that are laterally spaced and that correspond to the second electronic devices 120b. By spacing the individual segments, isolation regions for electrically insulating the second electronic devices 120b from one another may advantageously be omitted from the epitaxial layer 122. Such isolation regions include, for example, shallow, implant, and deep trench isolation regions. The epitaxial layer 122 may be, for example, a layer of monocrystalline silicon, amorphous silicon, or some other semiconductor material.

The second electronic devices 120b are arranged in the epitaxial layer 122, between the epitaxial layer 122 and a second wiring layer, and are electrically coupled to the second BEOL interconnect structure 110. In some embodiments, the second electronic devices 120b comprise second transistors. The second transistors may, for example, comprise corresponding gate electrodes 240 and a gate dielectric layer 242 spacing the gate electrodes 240 from the epitaxial layer 122. The gate electrodes 240 may be, for example, doped polysilicon, a metal, or some other conductive material, and the gate dielectric layer 242 may be, for example, silicon dioxide, a high κ dielectric, some other dielectric, or a combination of the foregoing. Further, the second transistors may, for example, comprise corresponding pairs of doped source/drain regions 244 arranged in the epitaxial layer 122, respectively on opposite sides of the gate electrodes 240.

As illustrated by the cross-sectional view 200D of FIG. 2D, a variant of FIG. 2A is provided in which second electronic devices 120c are defined by the second wiring layers 116 of the second BEOL interconnect structure 110. For example, the second electronic devices 120c may be or otherwise comprise passive inductors, resistors, or capacitors. As another example, the second electronic devices 120c may be or otherwise comprise passive electronic devices other than resistors. Further, the second electronic devices 120c are electrically coupled to the second BEOL interconnect structure 110 and, in some embodiments, are electrically coupled to the first electronic devices 108 and/or the first BEOL interconnect structure 106 through the second BEOL interconnect structure 110 and the TSVs 112. Also illustrated, in some embodiments, thicknesses $T_1$ of the second wiring layers 116 vary within the second BEOL interconnect structure 110 and/or vary from thicknesses of the first wiring layers 204. For example, a topmost one of the second wiring layers 116 may have a greater thickness than underlying ones of the second wiring layers 116.

With reference to FIGS. 3-5, 6A-6G, and 7A-7H, a series of cross-sectional views 300-500, 600A-600G, 700A-700H for various embodiments of a method of manufacturing an IC with electronic devices arranged on both a front side of a semiconductor substrate and a back side of the semiconductor substrate is provided.

As illustrated by the cross-sectional view 300 of FIG. 3, a first IC die 102 and a support structure 132 are provided or otherwise formed. The first IC die 102 comprises a first semiconductor substrate 104 and a first BEOL interconnect structure 106. The first BEOL interconnect structure 106 underlies the first semiconductor substrate 104, on a front side of the first semiconductor substrate 104, and comprises first wiring layers 204 alternatingly stacked with first via layers 202 in a first ILD layer 206. Further, the first IC die 102 comprises first electronic devices 108 arranged in the first semiconductor substrate 104, between the first BEOL interconnect structure 106 and the first semiconductor substrate 104, and/or arranged in the first BEOL interconnect structure 106. The first electronic devices 108 comprise active and/or passive electronic devices, such as, for example, the illustrated transistors.

The support structure 132 is carrier substrate in some embodiment, and a second IC die in other embodiments. The second IC die comprises a second semiconductor substrate 136 and a third BEOL interconnect structure 138 overlying the second semiconductor substrate 136. The third BEOL interconnect structure 138 comprises third wiring layers 230 alternatingly stacked with third via layers 228 in a third ILD layer 232. Further, the second IC die 132 comprises third electronic devices 140 arranged in the third BEOL interconnect structure 138 and/or arranged between the third BEOL interconnect structure 138 and the second semiconductor substrate 136. The third electronic devices 140 comprise active and/or passive electronic devices, such as, for example, the illustrated transistors.

Also illustrated by the cross-sectional view 300 of FIG. 3, the first IC die 102 is bonded to the support structure 132 through the first BEOL interconnect structure 106. In some embodiments where the support structure 132 is the second IC die, the first IC die 102 is bonded and electrically coupled to the second IC die through an interface between the first BEOL interconnect structure 106 and the third BEOL interconnect structure 138. Further, in some embodiments where the support structure 132 is the second IC die, the first IC die 102 is bonded and electrically coupled to the second IC die by hybrid bonding.

In some embodiments where hybrid bonding is employed to bond the first IC die 102 to the second IC die, a pair of IDD layers 224 and a pair of inter-die RDLs 226 are respectively arranged on the first IC die 102 and the second IC die. A first one of the IDD layers 224 and a first one of the inter-die RDL 226 are affixed to the first BEOL interconnect structure 106, on an opposite side of the first BEOL interconnect structure 106 as the first semiconductor substrate 104. Further, a second one of the IDD layers 224 and a second one of the inter-die RDLs 226 are affixed to the third BEOL interconnect structure 138, on an opposite side of the third BEOL interconnect structure 138 as the second semiconductor substrate 136. The inter-die RDLs 226 are respectively arranged within the IDD layers 224 and are electrically coupled respectively to the first and third BEOL interconnect structures 106, 138. During bonding, the IDD layers 224 and the inter-die RDLs 226 are pressed together and, in some embodiments, annealed to define a hybrid bond with, for example, a dielectric-to-dielectric bond between the IDD layers 224 and a metal-to-metal bond between the inter-die RDLs 226.

Figure 4:
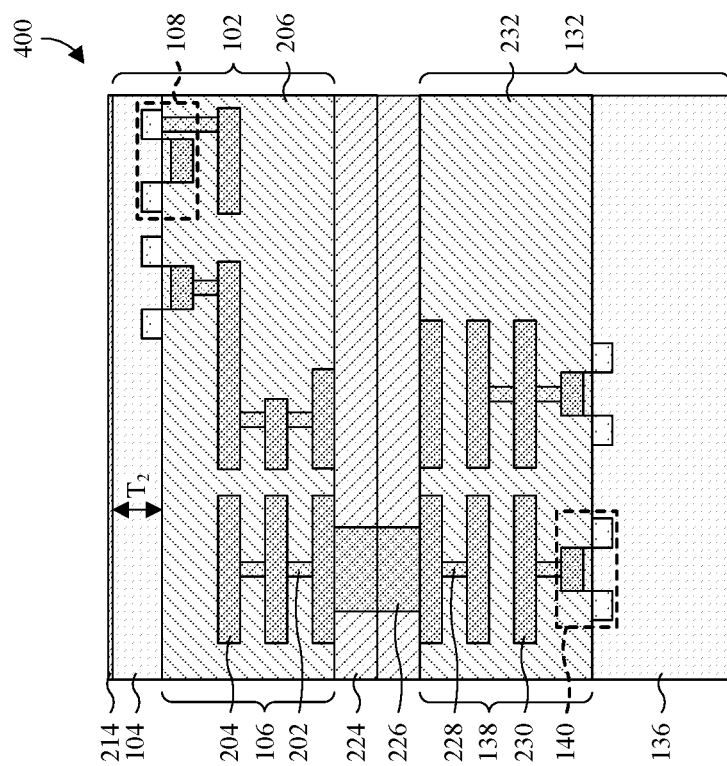

As illustrated by the cross-sectional view 400 of FIG. 4, a thinning process is performed to reduce a thickness $T_2$ of the first semiconductor substrate 104. In some embodiments, the thickness $T_2$ of the first semiconductor substrate 104 is reduced to about 1-100, about 1-10, or about 20-30 micrometers. Further, in some embodiments, the thinning process comprises a chemical mechanical polish (CMP) and/or an etch back.

Also illustrated by the cross-sectional view 400 of FIG. 4, a back side dielectric layer 214 is formed over the first semiconductor substrate 104, on a back side of the first semiconductor substrate 104, to advantageously protect the first semiconductor substrate 104 and/or to repair damage to the first semiconductor substrate 104 from the thinning process. The back side dielectric layer 214 may, for example, be formed by vapor deposition, thermal oxidation, or some other growth or deposition process.

While the embodiments of FIG. 4 and the subsequently described embodiments of FIGS. 5, 6A-6G, and 7A-7H include the back side dielectric layer 214, the back side dielectric layer 214 may be omitted in other embodiments. In some of such other embodiments, a laser anneal may be performed to the back side of the first semiconductor substrate 104, in place of forming the back side dielectric layer 214, to repair damage to the first semiconductor substrate 104 from the thinning.

Figure 5:
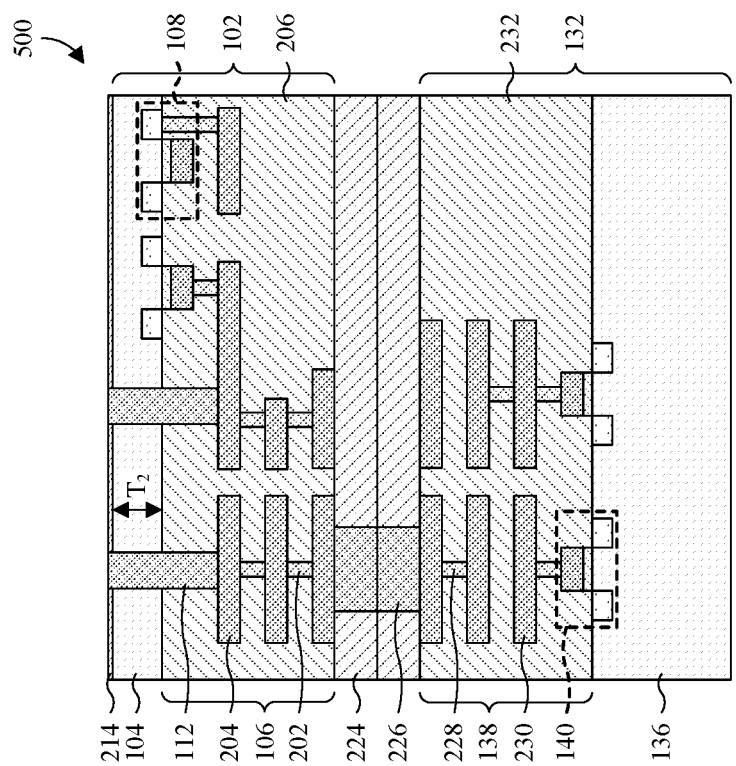

As illustrated by the cross-sectional view 500 of FIG. 5, TSVs 112 are formed extending through the first semiconductor substrate 104 and the back side dielectric layer 214 to a first wiring layer of the first BEOL interconnect structure 106. In some embodiments, the process for forming the TSVs 112 comprises performing a selective etch through the first semiconductor substrate 104 and the back side dielectric layer 214, into the first ILD layer 206, and stopping on the first wiring layer. The selective etch may be performed using, for example, photolithography and a reactive ion etch. Further, in some embodiments, the process comprises depositing a conductive layer in and covering an opening formed by the selective etch, and subsequently planarizing and/or etching back the conductive layer until an upper or top surface of the conductive layer is even with an upper or top surface of the back side dielectric layer 214. The planarization may, for example, be performed by CMP.

With reference to FIGS. 6A-6G, a series of cross-sectional views 600A-600G of first embodiments of the method for manufacturing an IC with electronic devices arranged on both front and back sides of a semiconductor substrate is provided. FIGS. 600A-600G correspond to, for example, FIG. 2A.

Figure 6B:
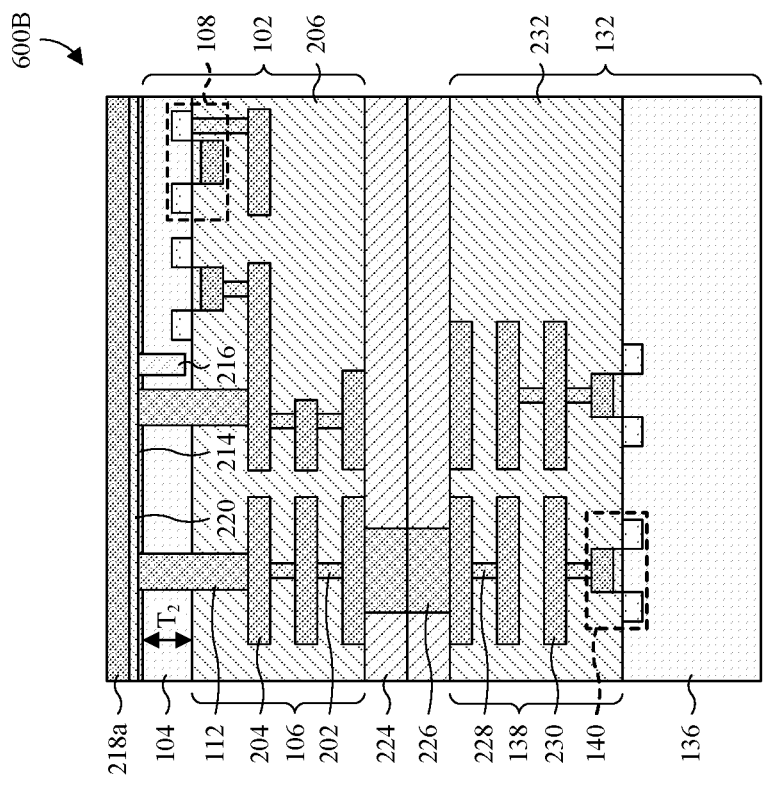
Figure 6A:
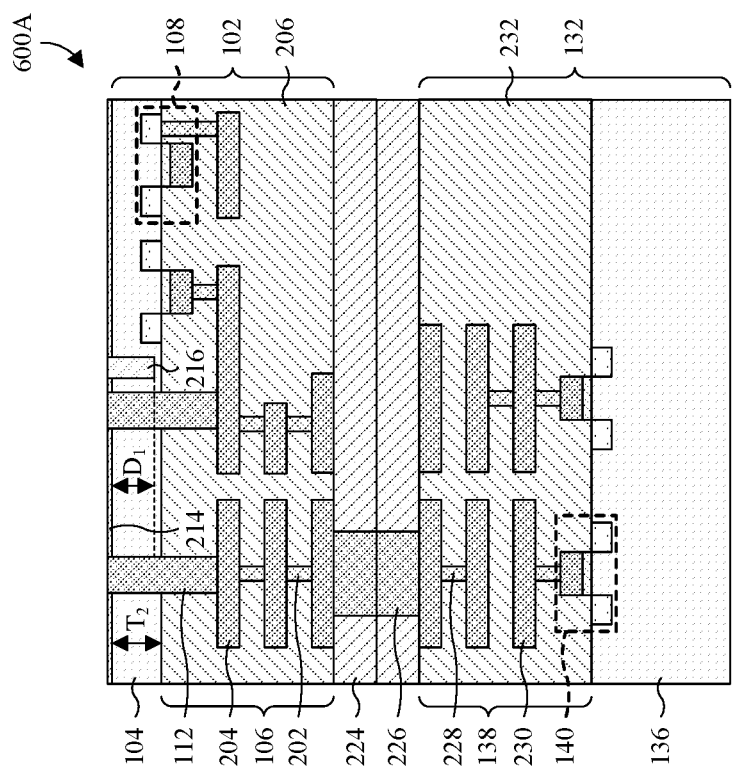

As illustrated by the cross-sectional view 600A of FIG. 6A, a back side isolation region 216 is formed in the first semiconductor substrate 104 to electrically isolate second electronic devices under manufacture. The back side isolation region 216 may, for example, be formed extending into the first semiconductor substrate 104 to a depth $D_1$ of about 0.1-5.0 micrometers, such as about 1 or 2 micrometers.

In some embodiments, the process for forming the back side isolation region 216 comprises performing a selective etch through the first semiconductor substrate 104 and the back side dielectric layer 214, and stopping at a location spaced between top and bottom surfaces of the first semiconductor substrate 104. The selective etch may be performed using, for example, photolithography and a reactive ion etch. Further, in some embodiments, the process comprises depositing a dielectric layer in and covering the opening formed by the etch, and subsequently planarizing and/or etching back the dielectric layer until an upper or top surface of the dielectric layer is even with an upper or top surface of the back side dielectric layer 214. The planarization may, for example, be performed by CMP.

As illustrated by the cross-sectional view 600B of FIG. 6B, a gate dielectric layer 220 and a gate electrode layer 218a are formed stacked over the back side dielectric layer 214. The gate dielectric layer 220 may, for example, be grown or deposited by thermal oxidation, chemical vapor deposition (CVD), physical vapor deposition (PVD), atomic layer deposition (ALD), or some other growth or deposition process. The gate electrode layer 218a is formed over the gate dielectric layer 220 and may, for example, be grown or deposited by CVD, PVD, ALD, electro chemical plating (ECP), or some other growth or deposition process.

Figure 6D:
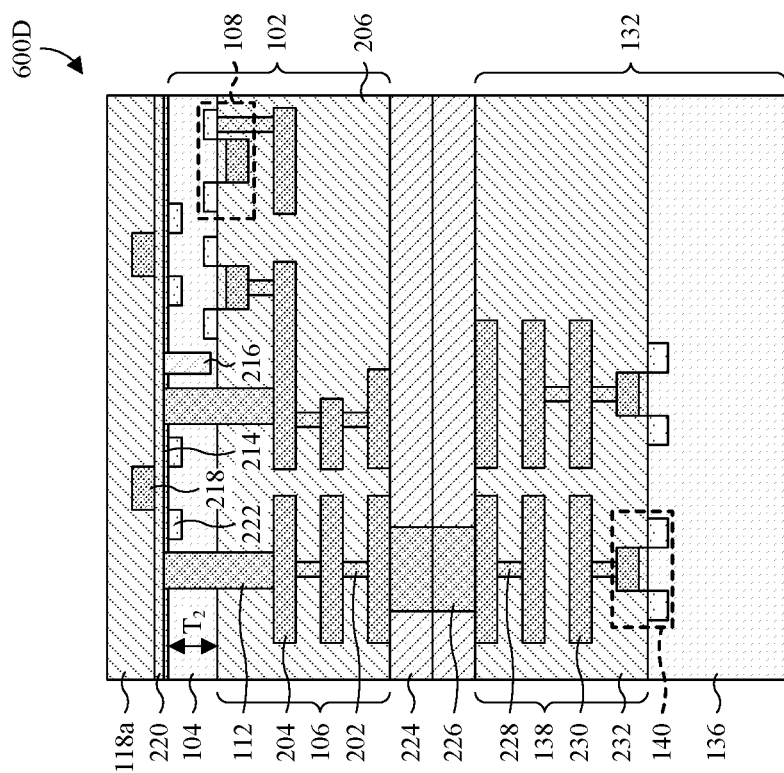
Figure 6C:
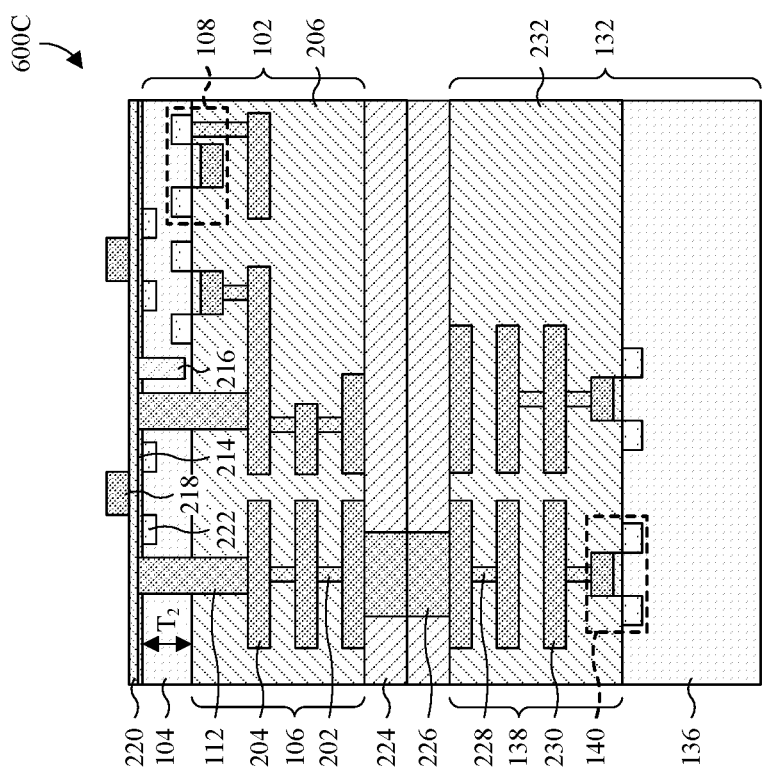

As illustrated by the cross-sectional view 600C of FIG. 6C, the gate electrode layer 218a (see FIG. 6B) is patterned to define individual gate electrodes 218 for the second electronic devices under manufacture. In some embodiments, the gate dielectric layer 220 is patterned with the gate electrode layer 218a, such that the gate dielectric layer 220 has individual segments corresponding to the gate electrodes 218 after patterning. The patterning may, for example, be performed by photolithography in which photoresist is formed over the gate electrode layer 218a, exposed to patterned radiation, developed, and then used as a mask during an etch into the gate electrode layer 218a and, in some embodiments, the gate dielectric layer 220.

Also illustrated by the cross-sectional view 600C of FIG. 6C, pairs of doped source/drain regions 222 corresponding to the gate electrodes 218 are formed in the first semiconductor substrate 104, such that the doped source/drain regions 222 are respectively arranged on opposite sides of corresponding ones of the gate electrodes 218. The doped source/drain regions 222 may, for example, be formed by ion implantation.

As illustrated by the cross-sectional view 600D of FIG. 6D, a second ILD layer 118a is formed covering the gate electrodes 218 and the back side dielectric layer 214. In some embodiments, the process for forming the second ILD layer 118a comprises depositing the second ILD layer 118a by, for example, CVD or PVD. Further, in some embodiments, the process comprises performing a planarization into an upper or top surface of the second ILD layer 118a. The planarization may, for example, be performed by CMP.

Figure 6F:
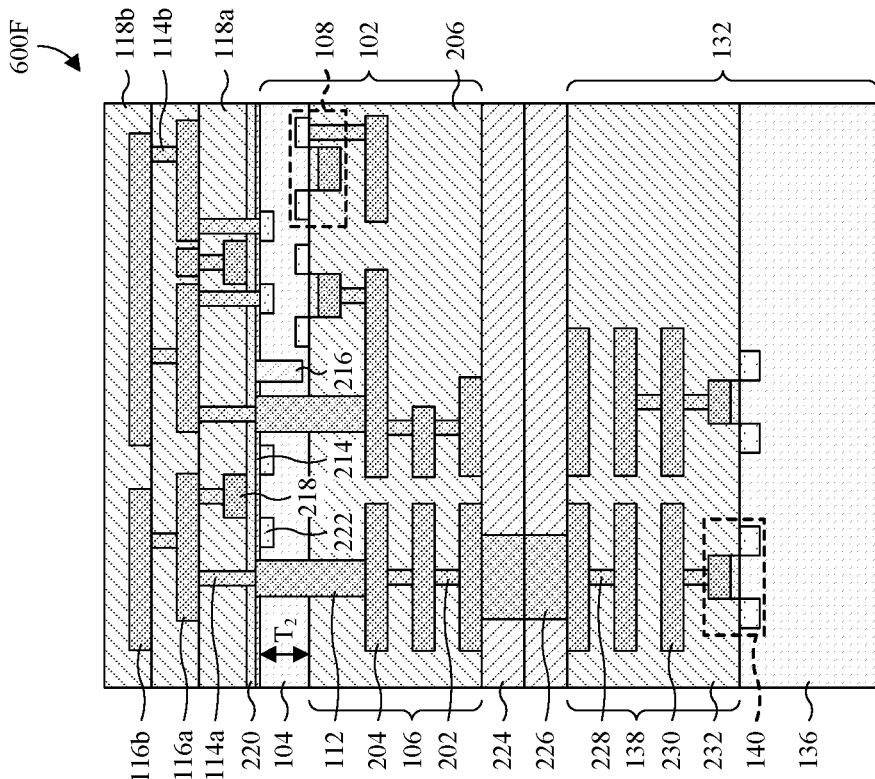
Figure 6E:
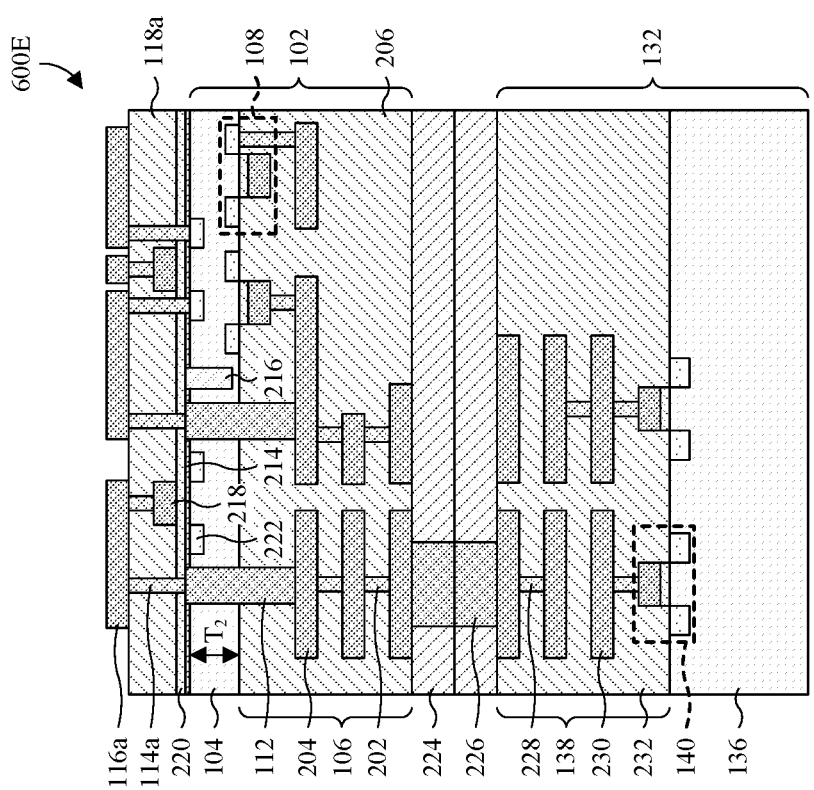

As illustrated by the cross-sectional view 600E of FIG. 6E, a second wiring layer 116a and a second via layer 114a are formed by either a single-damascene-like process or a dual-damascene-like process. A single-damascene-like process and a dual-damascene-like process are respectively single and dual damascene processes that are not restricted to copper. Therefore, in some embodiments, the process for forming the second wiring layer 116a and the second via layer 114a comprises performing a selective etch into the second ILD layer 118a to form via openings with a pattern of the second via layer 114a, and subsequently forming a conductive layer in and over the via openings. The etch may be, for example, performed through a photoresist layer patterned using photolithography. Even more, in some embodiments, the process comprises a planarization into an upper or top surface of the conductive layer, and patterning the conductive layer according to a pattern of the second wiring layer 116a. The patterning may, for example, be performed using photolithography.

As illustrated by the cross-sectional view 600F of FIG. 6F, the actions of FIGS. 6D and 6E are repeated one or more times to form additional second via, wiring, and ILD layers 114b, 116b, 118b.

As illustrated by the cross-sectional view 600G of FIG. 6G, a passivation layer 124 and a pad structure 126 are formed over the structure of FIG. 6F. Further, the pad structure 126 is formed electrically coupled to a pad via 130 extending from the pad structure 126, into a second ILD layer 118, to a second wiring layer.

While the embodiments of FIGS. 6A-6G illustrate the back side dielectric layer 214 as being formed before forming the second electronic devices 120a, the back side dielectric layer 214 may be formed after forming the second electronic devices 120a in other embodiments. For example, as illustrated in FIG. 2B, the back side dielectric layer 214 may be formed after forming the second electronic devices 120a and over the second electronic devices 120a. Further, while not discussed above, the acts of FIGS. 4, 5, and 6A-6G may be limited to low temperature processes in some embodiments to avoid wafer cracking. As used here, low temperature processes are restricted to temperatures below, for example, 450 degrees Celsius.

With reference to FIGS. 7A-7H, a series of cross-sectional views 700A-700H of second embodiments of the method for manufacturing an IC with electronic devices arranged on both front and back sides of a semiconductor substrate is provided. FIGS. 7A-7H are alternatives to FIGS. 6A-6E and correspond to, for example, FIG. 2C.

As illustrated by the cross-sectional view 700A of FIG. 7A, a second ILD layer 118a is formed covering the back side dielectric layer 214. In some embodiments, the process for forming the second ILD layer 118a comprises depositing or growing the second ILD layer 118a. Further, in some embodiments, the process comprises performing a planarization into an upper or top surface of the second ILD layer 118a.

Figure 7C:
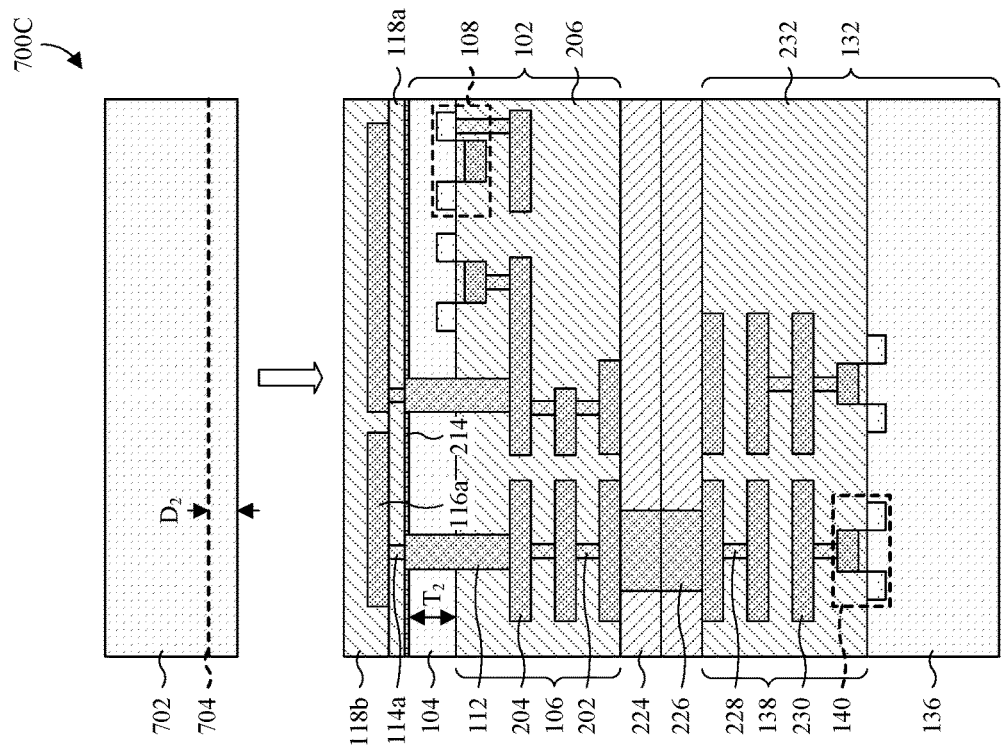
Figure 7B:
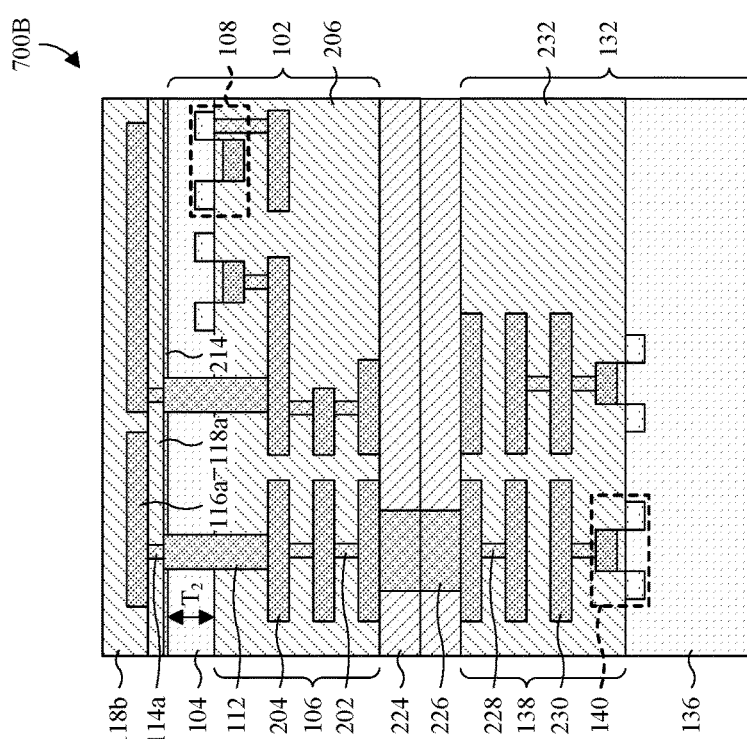

As illustrated by the cross-sectional view 700B of FIG. 7B, a second wiring layer 116a and a second via layer 114a are formed by either a single-damascene-like process or a dual-damascene-like process. A single-damascene-like process and a dual-damascene-like process are respectively single and dual damascene processes that are not restricted to copper.

Also illustrated by the cross-sectional view 700B of FIG. 7B, another second ILD layer 118b is formed covering the second via and wiring layers 114a, 116a. The second ILD layer 118b may, for example, be formed as described with regard to FIG. 7A.

As illustrated by the cross-sectional view 700C of FIG. 7C, a third semiconductor substrate 702 with an in-depth weakened layer 704 is provided or otherwise formed. The third semiconductor substrate 702 may be, for example, a bulk substrate of monocrystalline silicon or some other semiconductor, and the in-depth weakened layer 704 may be, for example, region of the third semiconductor substrate 702 that is structurally weaker than other regions of the third semiconductor substrate 702. Further, the in-depth weakened layer 704 may, for example, be arranged at a depth $D_2$ of about 0.3-10 micrometers. In some embodiments, the process for forming the third semiconductor substrate 702 with the in-depth weakened layer 704 comprises implanting hydrogen ions into the third semiconductor substrate 702, along a region of the semiconductor substrate 702 corresponding to the in-depth weakened layer 704.

Also illustrated by the cross-sectional view 700 of FIG. 7C, the third semiconductor substrate 702 is bonded to the first IC die 102 through the second ILD layers 118a, 118b. In some embodiments, the third semiconductor substrate 702 is bonded to the first IC die 102 by fusion bonding between the third semiconductor substrate 702 and a top one of the second ILD layers 118a, 118b.

Figure 7E:
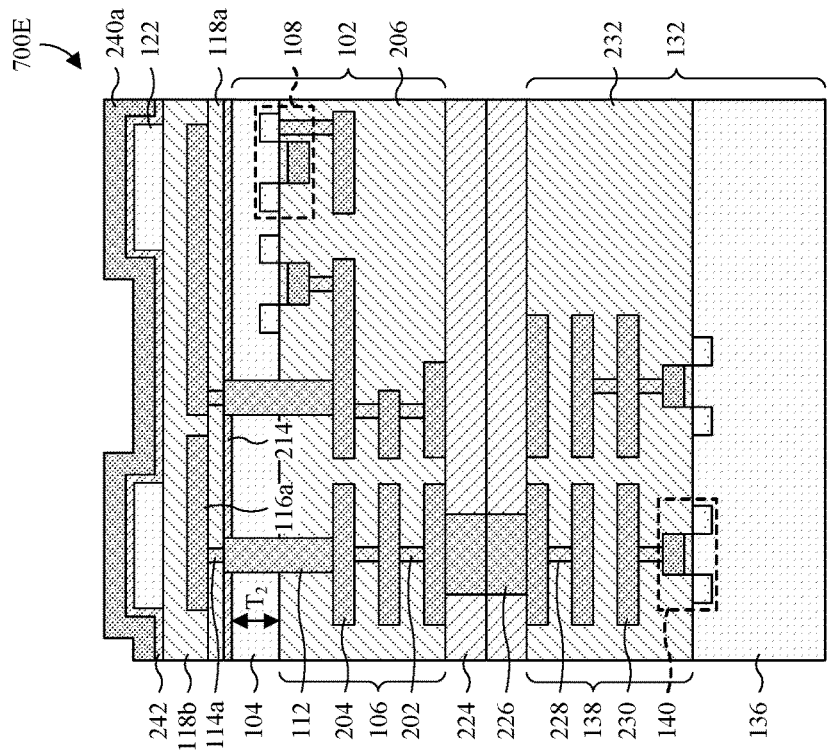
Figure 7D:
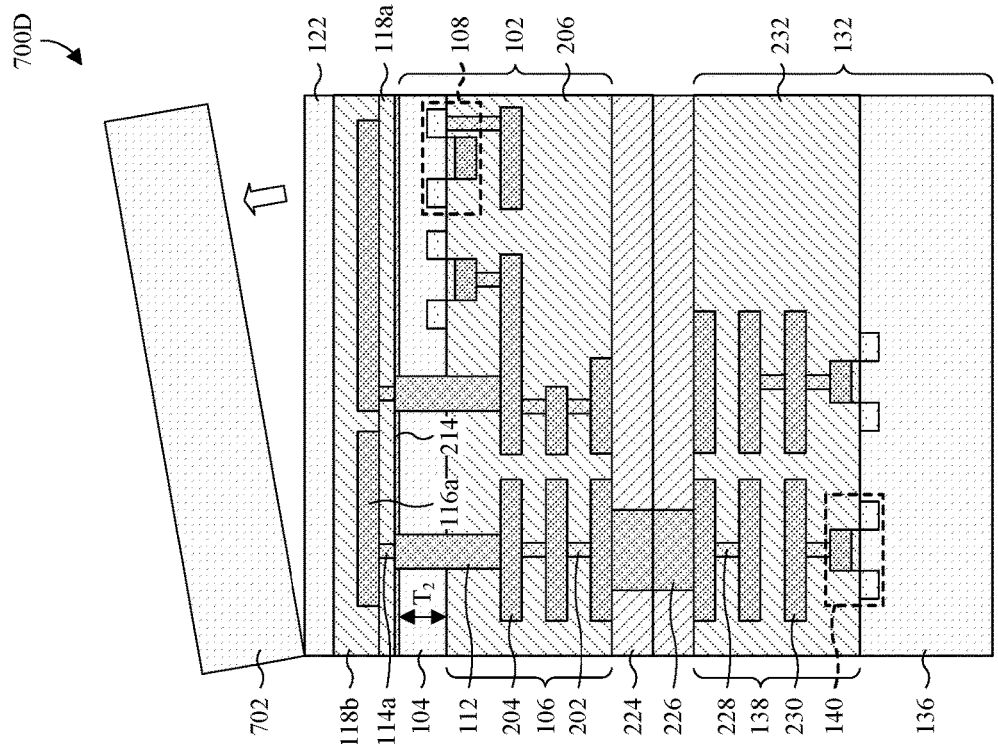

As illustrated by the cross-sectional view 700D of FIG. 7D, the third semiconductor substrate 702 is cleaved along the in-depth weakened layer 704 (see FIG. 7C) to remove a top portion of the third semiconductor substrate 702 and to leave an epitaxial layer 122 bonded to the first IC die 102 through the second ILD layers 118a, 118b.

As illustrated by the cross-sectional view 700E of FIG. 7E, the epitaxial layer 122 is patterned to define individual segments corresponding to second electronic devices under manufacture. The epitaxial layer 122 may, for example, be patterned using photolithography in which a photoresist layer is formed over the epitaxial layer 122, exposed to patterned radiation, developed, and then used as a mask during an etch of the epitaxial layer 122.

Also illustrated by the cross-sectional view 700E of FIG. 7E, a gate dielectric layer 242 and a gate electrode layer 240a are formed stacked over the epitaxial layer 122. In some embodiments, the gate dielectric layer 242 and/or the gate electrode layer 240a are formed conformally. The gate dielectric layer 242 may, for example, be grown or deposited by thermal oxidation, CVD, PVD, ALD, or some other growth or deposition process. The gate electrode layer 240a is formed over the gate electrode layer 242 and may, for example, be grown or deposited by CVD, PVD, ALD, ECP, or some other growth or deposition process.

Figure 7G:
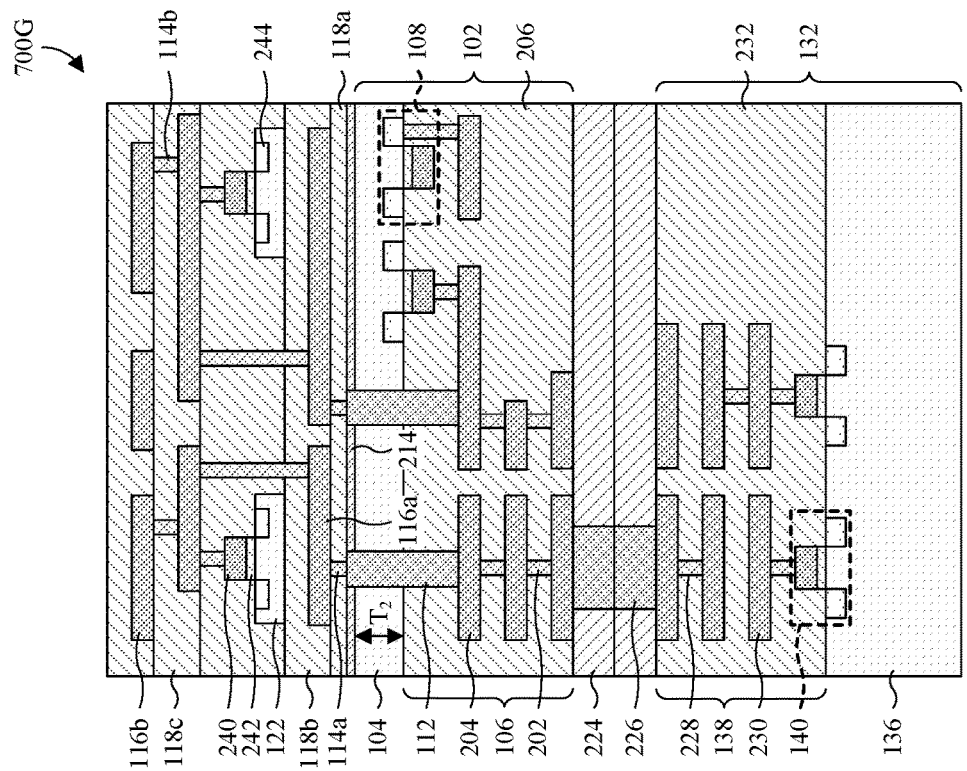
Figure 7F:
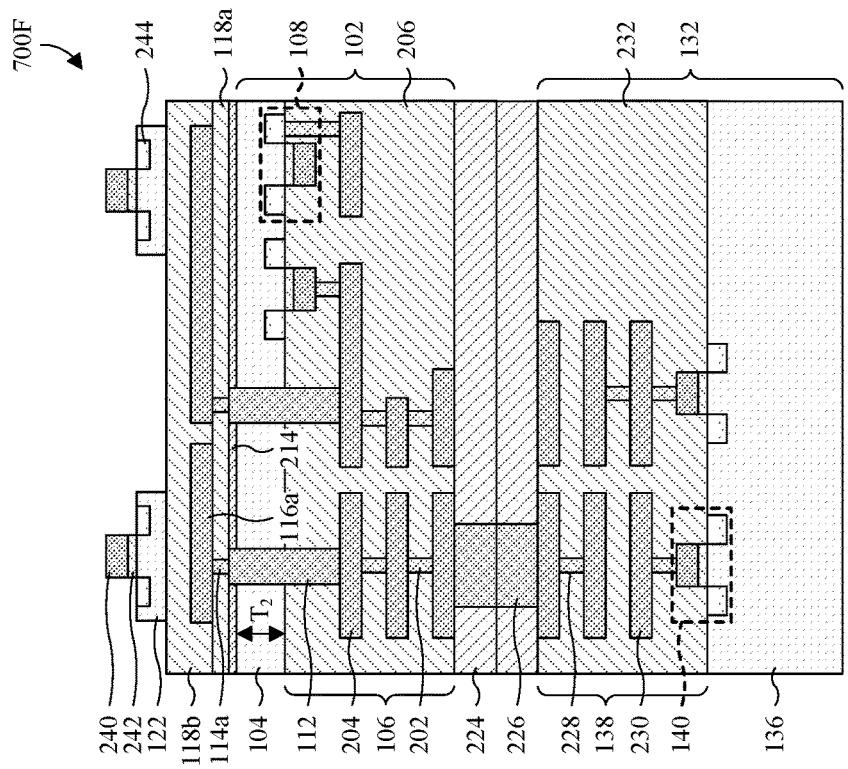

As illustrated by the cross-sectional view 700F of FIG. 7F, the gate electrode layer 240a (see FIG. 7E) is patterned to define individual gate electrodes 240 for the second electronic devices under manufacture. Further, the gate dielectric layer 242 is patterned with the gate electrode layer 240a, such that the gate dielectric layer 242 has individual segments corresponding to the gate electrodes 240 after patterning. The patterning may, for example, be performed by photolithography in which photoresist is formed over the gate electrode layer 240a, exposed to patterned radiation, developed, and then used as a mask during an etch into the gate electrode layer 240a and the gate dielectric layer 242.

Also illustrated by the cross-sectional view 700F of FIG. 7F, pairs of doped source/drain regions 244 corresponding to the gate electrodes 240 are formed in the epitaxial layer 122, such that the doped source/drain regions 244 are respectively arranged on opposite sides of corresponding ones of the gate electrodes 240. The doped source/drain regions 244 may, for example, be formed by ion implantation.

As illustrated by the cross-sectional view 700G of FIG. 7G, the actions of FIG. 7B are repeated one or more times to form additional second via, wiring, and ILD layers 114b, 116b, 118c.

As illustrated by the cross-sectional view 700H of FIG. 7H, a passivation layer 124 and a pad structure 126 are formed over the structure of FIG. 7G. Further, the pad structure 126 is formed electrically coupled to a pad via 130 extending from the pad structure 126, into a second ILD layer 118, to a second wiring layer.

While FIGS. 7C and 7D illustrate a specific approach to forming the epitaxial layer 122, other approaches are amenable. For example, the epitaxial layer 122 may be deposited. Even more, while not discussed above, the acts of FIGS. 4, 5, and 7A-7H may be limited to low temperature processes in some embodiments to avoid wafer cracking.

With reference to FIG. 8, a flowchart 800 of some embodiments of the method of FIGS. 3-5, 6A-6G, and 7A-7H is provided.

At 802, an IC die is bonded to a support structure through a first BEOL interconnect structure of the IC die. The first BEOL interconnect structure and a first electronic device of the IC die are on a front side of a semiconductor substrate of the IC die. See, for example, FIG. 3.

At 804, a back side dielectric layer is formed covering a back side of the semiconductor substrate. See, for example, FIG. 4.

At 806, a TSV is formed extending through the back side dielectric layer and the semiconductor substrate to the first BEOL interconnect structure. See, for example, FIG. 5.

At 808, a second electronic device and a second BEOL interconnect structure are formed on the back side of the semiconductor substrate. The second electronic device is formed electrically coupled to the first BEOL interconnect structure through the TSV and the second BEOL interconnect structure. See, for example, FIGS. 6A-6F or FIGS. 7A-7G.

At 810, a pad structure is formed over and electrically coupled to the second BEOL interconnect structure. See, for example, FIG. 6G or 7H.

Advantageously, by arranging electronic devices on both the front and back sides of the semiconductor substrate, the functional density of the IC may be high and/or the size of the IC may be small. Further, design freedom and flexibility may be high since electronic devices may be distributed between the front and back sides of the semiconductor substrate. Even more, power consumption is low and performance is high since TSVs provide a short path between the front and back sides of the semiconductor substrate.

While the method described by the flowchart 800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases. For example, the act of 804 may be omitted in some embodiments.

In view of the foregoing, in some embodiments, the present disclosure provides an IC comprising a semiconductor substrate, a first BEOL interconnect structure, a second BEOL interconnect structure, a first electronic device, a second electronic device, and a TSV. The first BEOL interconnect structure and the second BEOL interconnect structure are respectively under and over the semiconductor substrate. The first electronic device and the second electronic device are between the semiconductor substrate and respectively a bottom of the first BEOL interconnect structure and a top of the second BEOL interconnect structure. The TSV extends through the semiconductor substrate, from the first BEOL interconnect structure to the second BEOL interconnect structure.

In other embodiments, the present disclosure provides a method for manufacturing an IC. A first BEOL interconnect structure and a first electronic device are formed on a bottom of a semiconductor substrate, where the first electronic device is between the semiconductor substrate and a bottom of the first BEOL interconnect structure. A TSV is formed extending through the semiconductor substrate to the first BEOL interconnect structure. A second BEOL interconnect structure and a second electronic device are formed on a top of the semiconductor substrate, where the second BEOL interconnect structure contacts the TSV, and where the second electronic device is between the semiconductor substrate and a top of the second BEOL interconnect structure.

In yet other embodiments, the present disclosure provides another IC comprising a first IC die, a second BEOL interconnect structure, a second IC die, and a TSV. The first IC die comprises a first semiconductor substrate, a first BEOL interconnect structure, and a first electronic device, where the first BEOL interconnect structure underlies the first semiconductor substrate, and where the first electronic device is between the first semiconductor substrate and the first BEOL interconnect structure. The second BEOL interconnect structure and a second electronic device are both over the first IC die, where the second electronic device is between the first semiconductor substrate and a top of the second BEOL interconnect structure. The second IC die comprises a second semiconductor substrate, a third BEOL interconnect structure, and a third electronic device, where the third BEOL interconnect structure overlies the second semiconductor substrate, where the third electronic device is between the second semiconductor substrate and the third BEOL interconnect structure, and where the second IC die is bonded and electrically coupled to the first IC die by a bond interface layer between the first and third BEOL interconnect structures. The TSV extends through the first semiconductor substrate, from the first BEOL interconnect structure to the second BEOL interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a substrate;
   a frontside interconnect structure on a frontside of the substrate and comprising multiple levels of frontside wires that are vertically stacked;
   a frontside electronic device partially defined by the substrate on the frontside of the substrate and directly contacting the frontside interconnect structure, wherein the frontside electronic device comprises a frontside gate electrode and a pair of frontside source/drain regions that are vertically between the frontside gate electrode and the substrate;
   a dielectric structure directly contacting the substrate on a backside of the substrate that is opposite the frontside of the substrate;

a backside interconnect structure on the backside of the substrate and comprising multiple levels of backside wires that are vertically stacked in the dielectric structure;

a backside electronic device on the backside of the substrate and directly contacting the backside interconnect structure, wherein the backside electronic device comprises a backside gate electrode and a pair of backside source/drain regions that are vertically between the backside gate electrode and the substrate, and wherein the dielectric structure is continuous from the substrate to the backside electronic device; and a shallow trench isolation (STI) structure inset into a top surface of the substrate, which faces the backside interconnect structure, wherein the STI structure is continuous and unbroken from a first location level with the frontside electronic device to a second location level with the backside electronic device.

2. The IC according to claim 1, wherein the backside electronic device is partially defined by the substrate, and wherein semiconductor material of the substrate extends continuously from the frontside electronic device to the backside electronic device.

3. The IC according to claim 1, wherein the dielectric structure has a dielectric region that extends continuously from direct contact with the backside electronic device to direct contact with the substrate at a contact location, and wherein the substrate has a semiconductor region that extends continuously from direct contact with the dielectric structure at the contact location to direct contact with the frontside electronic device.

4. The IC according to claim 1, wherein the substrate consists of a single piece of semiconductor material that is continuous throughout an entirety of the substrate.

5. The IC according to claim 1, further comprising:
a through substrate via (TSV) extending entirely through the substrate, beginning at the frontside interconnect structure and ending at the backside interconnect structure, to electrically couple the frontside interconnect structure to the backside interconnect structure.

6. The IC according to claim 5, wherein the backside electronic device comprises a backside gate dielectric layer vertically between the backside gate electrode and the backside source/drain regions, and wherein the backside gate dielectric layer directly contacts the TSV.

7. The IC according to claim 1, wherein an entirety of the STI structure is spaced from, and elevated above, a bottom surface of the substrate, which faces the frontside interconnect structure, and wherein the second location is elevated above the top surface of the substrate.

8. The IC according to claim 1, wherein the backside electronic device comprises a backside gate dielectric layer separating the backside gate electrode from the substrate, and wherein the second location is in direct contact with the backside gate dielectric layer.

9. An integrated circuit (IC) comprising:
a first interconnect structure comprising a plurality of first wires and a plurality of first vias that are alternatingly stacked;
a pad structure and a solder bump stacked upon each other;
a substrate and a through substrate (TSV) between the first interconnect structure and the pad structure, wherein the TSV extends through the substrate beginning at a first TSV surface of the TSV and terminating at a second TSV surface of the TSV, and wherein the first TSV surface directly contacts one of the first wires;
a first electronic device partially defined by the substrate and between the substrate and the first interconnect structure;
a second interconnect structure between and directly contacting the substrate and the pad structure, wherein the second interconnect structure comprises a plurality of second wires and a plurality of second vias, wherein the second wires and the second vias are alternatingly stacked continuously from the second TSV surface to the pad structure to define multiple wire levels and multiple via levels between the second TSV surface and the pad structure, and wherein the second TSV surface directly contacts one of the second vias; and
a second electronic device between the pad structure and the substrate;
wherein the one of the first wires has a greater width than the TSV at the first TSV surface, wherein the one of the second vias has a lesser width than the TSV at the second TSV surface, and wherein the first and second TSV surfaces are entirely conductive.

10. The IC according to claim 9, wherein the second electronic device is partially defined by the substrate, and wherein the substrate is unbroken from the first electronic device to the second electronic device.

11. The IC according to claim 9, wherein the second electronic device is an inductor defined by at least one of the wire levels.

12. The IC according to claim 9, wherein the second electronic device comprises a gate electrode and a gate dielectric layer, and wherein the gate dielectric layer directly contacts the second TSV surface.

13. The IC according to claim 9, wherein the substrate consists of a single piece of semiconductor material that is continuous from a bottommost surface of the substrate to a topmost surface of the substrate, and wherein the topmost and bottommost surfaces of the substrate respectively and directly contact the first and second interconnect structures.

14. The IC according to claim 9, further comprising:
a dielectric structure on an opposite side of the substrate as the first interconnect structure and accommodating the second interconnect structure; and
a plurality of epitaxial semiconductor layers in the dielectric structure, wherein the epitaxial semiconductor layers are spaced from each other and from the substrate at a common elevation and each has a pair of opposite sidewalls directly contacting the dielectric structure, and wherein a first epitaxial semiconductor layer of the plurality of epitaxial semiconductor layers partially defines the second electronic device;
wherein a dielectric portion of the dielectric structure directly contacts the first epitaxial semiconductor layer and is continuous from direct contact with the substrate to direct contact with the pad structure.

15. The IC according to claim 14, wherein the second electronic device is a transistor, and wherein the first epitaxial semiconductor layer accommodates only one transistor when viewed in cross section.

16. The IC according to claim 14, further comprising:
a third electronic device partially defined by the substrate and between the substrate and the first interconnect structure, where the third electronic device borders the first electronic device and comprises a gate electrode and a pair of source/drain regions that are vertically between the gate electrode and the substrate, and wherein the opposite sidewalls of the first epitaxial semiconductor layer respectively and directly overlie the first electronic device and the third electronic device.

17. An integrated circuit (IC) comprising:
a semiconductor substrate;
a first back-end-of-line (BEOL) interconnect structure and a second BEOL interconnect structure respectively under and over the semiconductor substrate;
a first electronic device in a bottom of the semiconductor substrate, between the semiconductor substrate and the first BEOL interconnect structure;
a through substrate via (TSV) extending through the semiconductor substrate, from the first BEOL interconnect structure to the second BEOL interconnect structure; and
a second electronic device between the semiconductor substrate and the second BEOL interconnect structure, wherein the second electronic device comprises a pair of source/drain regions, a gate dielectric layer, and a gate electrode, wherein the source/drain regions are in a top of the semiconductor substrate, wherein the gate electrode is laterally between the source/drain regions and is spaced over the semiconductor substrate by the gate dielectric layer, and wherein the gate dielectric layer overlies a top surface of the TSV;
wherein the TSV has a first sidewall and a second sidewall localized to a single side of the second electronic device and respectively on opposite sides of the TSV, wherein the TSV is continuous and unbroken laterally from the first sidewall to the second sidewall, and wherein the gate dielectric layer has a sidewall laterally between, and laterally offset from, the first and second sidewalls.

18. The IC according to claim 17, wherein the gate dielectric layer directly contacts the top surface of the TSV.

19. The IC according to claim 17, wherein the semiconductor substrate comprises a piece of semiconductor material that is unbroken from direct contact with the first electronic device to direct contact with the second electronic device.

20. The IC according to claim 17, further comprising:
a shallow trench isolation (STI) structure extending continuously from a top surface of the STI structure, which is at a same elevation as the second electronic device, to a bottom surface of the STI structure, which is at a same elevation as the first electronic device.

* * * * *